(12) United States Patent
Malik et al.

(10) Patent No.: US 6,522,190 B1
(45) Date of Patent: Feb. 18, 2003

(54) HIGH EFFICIENCY MULTIPLE INPUT VOLTAGE SOURCES POWER SUPPLY

(75) Inventors: Randhir Singh Malik, Cary, NC (US); Trung Minh Nguyen, Durham, NC (US); William Hemena, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/999,103

(22) Filed: Oct. 31, 2001

(51) Int. Cl.$^7$ .............................................. H03K 17/62
(52) U.S. Cl. ............................ 327/408; 327/63; 307/64
(58) Field of Search ................................ 327/530, 401, 327/407, 408, 63, 70; 307/64, 65, 125, 130

(56) References Cited

U.S. PATENT DOCUMENTS

| | | | |
|---|---|---|---|
| 4,754,160 A | 6/1988 | Ely ............................. | 307/64 |
| 4,788,450 A | 11/1988 | Wagner ....................... | 307/64 |
| 5,598,041 A | 1/1997 | Willis .......................... | 307/43 |
| 5,608,273 A | 3/1997 | Barlett ......................... | 307/64 |
| 5,811,895 A | 9/1998 | Suzuki et al. ............... | 307/125 |
| 5,886,561 A | 3/1999 | Eitan et al. ................. | 307/408 |
| 6,060,789 A | 5/2000 | Yamaguchi .................. | 307/66 |

OTHER PUBLICATIONS

M. Ferry et al., "Low Voltage Drop, Redundant Power Circuit," IBM Technical Disclosure Bulletin, vol. 34, No. 1, Jun. 1991, pp. 227–228.

*Primary Examiner*—Timothy P. Callahan
*Assistant Examiner*—An T. Luu
(74) *Attorney, Agent, or Firm*—Sawyer Law Group

(57) ABSTRACT

The present invention provides a highly efficient power supply with redundant multiple input voltage sources. The power supply uses switching transistors, specifically MOSFET's, to create paths for current from one of the voltage sources to the load. The switching transistors are switched either "on" or "off" by comparators which compare the output from the voltage sources. These comparators allow the highest voltage source to provide power to the load, and keep the other switching transistors "off" that connect the common load to other voltage sources. Because the switching transistors have lower conduction losses than diodes in conventional power supplies, the power supply in accordance with the present invention is more efficient.

23 Claims, 2 Drawing Sheets

HIGH EFFICIENCY MULTIPLE INPUT VOLTAGE SOURCES POWER SUPPLY

FIELD OF THE INVENTION

The present invention relates to power supplies, and more particularly to power supplies with multiple input voltage sources.

BACKGROUND OF THE INVENTION

The use of power supplies with multiple input voltage sources, in industries such as the telecommunications industry, is well known in the art. Power supplies with multiple input voltage sources provide redundancy in the system to ensure that power continues to be provided to the system, even when one of the voltage sources fail.

FIG. 1 illustrates a conventional multiple input voltage sources power supply circuit. The circuit 100 comprises a first voltage source 102 coupled in series to a first diode 106, a second voltage source 104 coupled in series to a second diode 108. The cathodes of the diodes 106 and 108 are coupled directly to the voltage sources 102 and 104, respectively, and the anodes of the diodes 106 and 108 are connected to the load 110, which is generally a DC-DC regulator.

When the first voltage source 102 is "on", i.e., supplying a voltage, such as −48V, and the second voltage source 104 is "off", i.e., either supplying less than −48V or not connected, then −48V is supplied to the load 110 by the first voltage source 102 because the second diode 108 is back biased. The second diode 108 prevents current from back flowing to the second voltage source 104, and thus prevents the second voltage source 104 from becoming a sink and overheating the power supply.

When the first voltage source 102 is "off", i.e., either supplying a voltage less than −48V or not connected, and the second voltage source 104 is "on", i.e., supplying −48V, then −48V is supplied to the load 110 by the second voltage source 104. The first diode 106 prevents current from back flowing to the first voltage source 102 because the first diode 106 is back biased, and thus preventing the first voltage source 102 from becoming a sink. Other voltage sources may be coupled to the load 110 and function in the same manner.

However, the loss of power in each diode 106 and 108 is significant for high powered loads. For example, for voltage sources which supply −48V, the loss per diode 106 or 108 could be as high as 10W for a 1 kW load. The conventional multiple input voltage sources power supply is thus inefficient.

Accordingly, there exists a need for a high efficiency multiple input voltage sources power supply. The power supply should provide higher efficiency than a conventional power supply and at the same time, provide a means for preventing current flow among different voltage sources connected to a common load. The present invention addresses such a need.

SUMMARY OF THE INVENTION

The present invention provides a highly efficient power supply with redundant multiple input voltage sources. The power supply uses switching transistors, specifically MOSFET's, to create paths for current from one of the voltage sources to the load. The switching transistors are switched either "on" or "off" by comparators which compare the output from the voltage sources. These comparators allow the highest voltage source to provide power to the load, and keep the other switching transistors "off" that connect the common load to other voltage sources. Because the switching transistors have lower conduction losses than diodes in conventional power supplies, the power supply in accordance with the present invention is more efficient.

DETAILED DESCRIPTION

The present invention provides a high efficiency multiple input voltage sources power supply. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The power supply in accordance with the present invention comprises redundant multiple input voltage sources which are highly efficient in supplying power to a load. The power supply uses switching transistors to create paths for current from one of the voltage sources to the load. The transistors are switched either "on" or "off" by comparators which compare the output from the voltage sources.

To more particularly describe the features of the present invention, please refer to FIG. 2 in conjunction with the discussion below.

Figure 2:
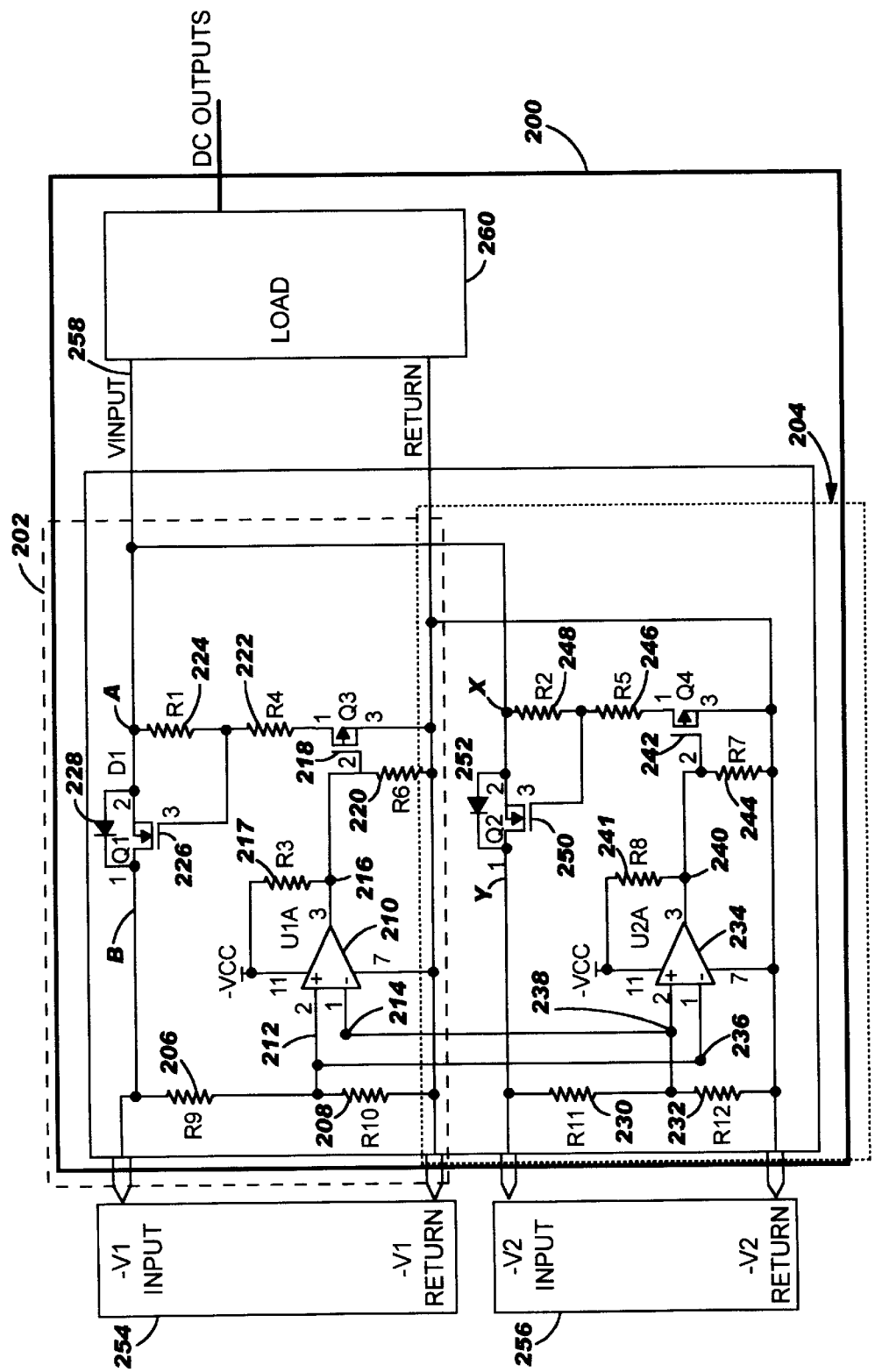
FIG. 2 illustrates a preferred embodiment of a multiple input voltage sources power supply in accordance with the present invention.

FIG. 2 illustrates a preferred embodiment of a multiple input voltage sources power supply in accordance with the present invention. The power supply 200 comprises a first circuit 202 for providing voltage from a first voltage source 254 to a load 260, and a second circuit 204 for providing voltage from a second voltage source 256 to the load 260. The returns of the first 254 and second 256 voltage sources are coupled.

The first circuit 202 comprises a resistor 206 (R9) coupled to a resistor 208 (Rio). R9 206 is coupled to the input of the first voltage source 254 and to R10 208. R10 208 is coupled to R9 206 and to a return of the first voltage source 254. Coupled to the common node of R9 206 and R10 208 is a non-inverting pin 212 of a first comparator 210 and an inverting pin 236 of a second comparator 234 of the second circuit 204. The first comparator 210 is powered by voltage source of −Vcc. A resister 217 (R3) is coupled to the −Vcc source and the output pin of the first comparator 210. The output pin 216 of the first comparator 210 is coupled to a gate of a first transistor 218 (Q3). A resistor 220 (R6) is coupled to the gate of Q3 218 and the return of the first voltage source 254. The source of Q3 218 is coupled to the return of the first voltage source 254. The drain of Q3 218 is coupled to a resister 222 (R4). R4 222 is coupled to another resister 224 (R) and to a gate of a second transistor 226 (Q1). In the preferred embodiment, Q1 226 and Q3 218 are switching transistors composed of Metal Oxide Semiconductor Field Effect Transistors (MOSFETs). The diode 228 (D1) represents an internal diode for Q1 226. The anode side of D1 228 is coupled to the source of Q1 226 and the cathode side of D1 228 is coupled to the drain of Q1 226. The drain of Q1 226 is also coupled to the input of the first voltage source 254. RI 224 is also coupled to the source of Q1 226, an anode side of a diode 228 (D1), and the output 258 to the load 260.

The second circuit 204 comprises a resister 230 (R11) coupled to a resistor 232 (R12). R11 230 is coupled to the input of the second voltage source 256 and to R12 232. R12 232 is coupled to R11 230 and to a return of the second voltage source 256. Coupled to the common node of R11 230 and R12 232 is a non-inverting pin 238 of the second comparator 234. The non-inverting pin 238 of the second comparator 234 is also coupled to an inverting pin 214 of the first comparator 210 of the first circuit 202. The inverting pin 236 of the second comparator 234 is coupled to the non-inverting pin 212 of the first comparator 210. The second comparator 234 is powered by a voltage source of –Vcc. A resister 241 (R8) is coupled to the –Vcc source and the output pin 240 of the second comparator 234. The output pin 240 of the second comparator 234 is coupled to a gate of a third transistor 242 (Q4). A resister 244 (R7) is coupled to the gate of Q43 242 and a return of the second voltage source 256. The source of Q4 242 is coupled to the return of the second voltage source 256. The drain of Q4 242 is coupled to a resister 246 (R5). R5 246 is coupled to another resister 248 (R2) and to a gate of a fourth transistor 250 (Q2). In the preferred embodiment, Q2 250 and Q4 242 are switching transistors comp0sed of MOSFETs. The diode 252 (D2) represents an internal diode for Q2 250. The anode side of D2 252 is coupled to the source of Q2 250 and the cathode side of D2 252 is coupled to the drain of Q2 250. The drain of Q2 250 is also coupled to the input of the second voltage source 256. R2 248 is also coupled to the source of Q2 250, an anode side of a diode 252 (D2), and the output 258 to the load 260.

R9 206 and R10 208 of the first circuit 202 sense the voltage from the first voltage source 254. R11 230 and R12 232 of the second circuit 204 sense the voltage from the second voltage source 256. The sensed voltage of the first voltage source 254 is provided to the non-inverting pin 212 of the first comparator 210 and the inverting pin 236 of the second comparator 234. The sensed voltage of the second voltage source 256 is provided to the inverting pin 214 of the first comparator 210 and the non-inverting pin 238 of the second comparator 234.

Assume that a first voltage from the first voltage source 254 is approximately –48V and a second voltage from the second voltage source 256 is approximately 0V, i.e., the first voltage source 254 is "on", and the second voltage source 256 is "off". At the first comparator 210, the voltage at the non-inverting pin 212 is greater than the voltage at the inverting pin 214. The voltage at the output pin 216 is thus approximately –Vcc. A voltage of –Vcc is applied to the gate of Q3 218. This turns Q3 218 "on". Turning Q3 218 "on" also turns Q1 226 "on". A path is thus created for a current in the first circuit 202, such that approximately –48V is provided at the output 258 by the first voltage source 254.

At the second comparator 234, the voltage at the inverting pin 236 is greater than the voltage at the non-inverting pin 238. The voltage at the output pin 240 is thus approximately 0V. Insufficient voltage is applied to the gate of Q4 242 for Q4 242 to conduct, thus Q4 242 is "off". Turning Q4 242 "off" also turns Q2 250 "off". No path is created for a current in the second circuit 204. Thus, no voltage is supplied to the output 258 by the second voltage source 256. The voltage at node X of the second circuit 204 is approximately –48V. The voltage at node Y of the second circuit 204 is approximately 0V. Because the voltage at the cathode of D2 252 is higher than the voltage at the anode, and because Q4 242 is "off", current is prevented from back flowing to the second voltage source 256. Thus, Q2 250 being "off" prevents cross-conduction of current between the first voltage source 254 and the second voltage source 256. This prevents the first voltage source 254 from overloading.

Assume that the first voltage from the first voltage source 254 is approximately 0V and the second voltage from the second voltage source 256 is approximately –48V, i.e., the first voltage source 254 is "off", and the second voltage source 256 is "on". At the second comparator 234, the voltage at the non-inverting pin 238 is greater than the voltage at the inverting pin 236. The voltage at the output pin 240 is thus approximately –Vcc. A voltage of –Vcc is applied to the gate of Q4 242. This turns Q4 242 "on". Turning Q4 242 "on" also turns Q2 250 "on". A path is thus created for a current in the second circuit 204, such that approximately –48V is provided at the output 258 by the second voltage source 256.

At the first comparator 210, the voltage at the inverting pin 214 is greater than the voltage at the non-inverting pin 212. The voltage at the output pin 216 is thus approximately 0V. Insufficient voltage is supplied to the gate of Q3 218 for Q3 218 to conduct. Thus, Q3 218 is "off". Turning Q3 218 "off" also turns Q1 226 "off". No path is created for a current in the first circuit 202. Thus, no voltage is supplied to the output 258 by the first voltage source 254. The voltage at node A of the first circuit 202 is approximately –48V. The voltage at node B of the first circuit 202 is approximately 0V. Because the voltage at the cathode of D1 228 is higher than the voltage at the anode, because D1 228 is back biased, and also because Q3 218 is "off", current is prevented from back flowing to the first voltage source 254. Thus, Q3 218 being "off" prevents cross-conduction of current between the first voltage source 254 and the second voltage source 256. This prevents the second voltage source 256 from overloading.

Assume that the first voltage from the first voltage source 254 is approximately –48V and the second voltage from the second voltage source 256 is either some voltage less than –48V, such as –40V, not connected. The voltage at the output 258 is still supplied by the first voltage supply 254, as in the case where the first voltage is –48V and the second voltage is 0V, described above. In this situation, the voltage at node X of the second circuit 204 is approximately –48V and the voltage at node Y of the second circuit 204 is approximately –40V. Since the voltage at the cathode of D2 252 is still higher than at the anode of D2 254, and Q2 250 is "off", cross conduction of current is prevented between the first 254 and second 256 voltage sources. Similarly, Q1 226 prevents cross-conduction of currents when the second voltage is approximately –48V and the first voltage is either some voltage less than –48V or not connected.

Figure 1:
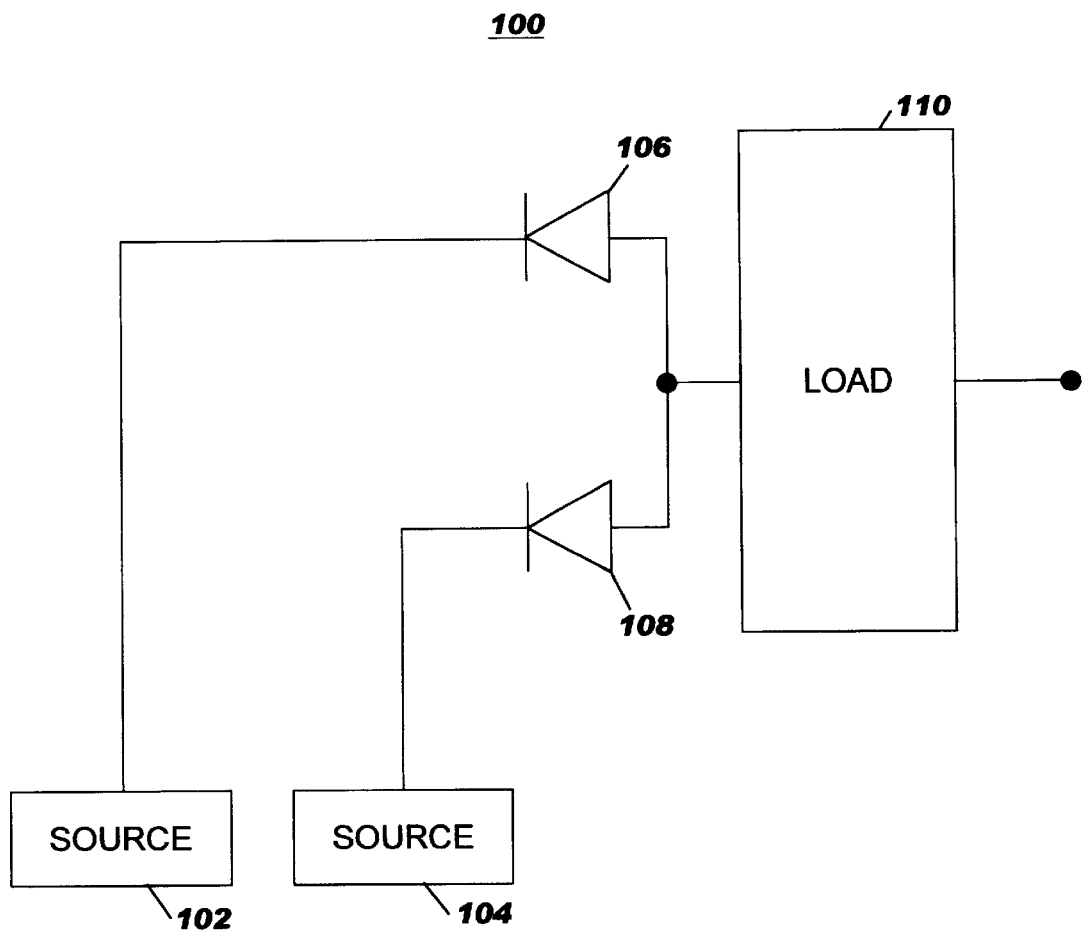
FIG. 1 illustrates a conventional multiple input voltage sources power supply circuit.

Because switching transistors Q1 226 and Q2 250 experience lower power loss than the diodes 106 and 108 of the conventional power supply (FIG. 1), the power supply in accordance with the present invention is significantly more efficient.

Although the present invention is described above with two voltage sources, one of ordinary skill in the art will understand that more than two voltage sources may be used without departing from the spirit and scope of the present invention.

A highly efficient power supply with redundant multiple input voltage sources has been described. The power supply uses switching transistors to create paths for current from one of the voltage sources to the load. The switching transistors are switched either "on" or "off" by comparators which compare the output from the voltage sources. Because the switching transistors have lower conduction losses than diodes in conventional power supplies, the power supply in accordance with the present invention is more efficient.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A power supply circuit including a first voltage source and a second voltage source, comprising:
    a first circuit coupled to the first voltage source, wherein the first circuit comprises:
        a first comparator for comparing a first voltage from the first voltage source with a second voltage from the second voltage source,
        a first transistor coupled to the first comparator, wherein the first transistor conducts when the first voltage is higher than the second voltage, and
        a second transistor coupled to the first transistor and the first voltage source, wherein the second transistor conducts when the first transistor conducts, wherein the first voltage is provided as an output voltage when the second transistor conducts; and
    a second circuit coupled to the second voltage source, wherein the second circuit comprises:
        a second comparator for comparing the second voltage with the first voltage,
        a third transistor coupled to the second comparator, wherein the third transistor conducts when the second voltage is higher than the first voltage, and
        a fourth transistor coupled to the third transistor and the second voltage source, wherein the fourth transistor conducts when the third transistor conducts, wherein the second voltage is provided as the output voltage when the fourth transistor conducts.

2. The circuit of claim 1, wherein the first circuit further comprises a means for sensing the first voltage, comprising:
    a first resistor coupled to an input of the first voltage source and a non-inverting pin of the first comparator; and
    a second resistor coupled to the first resistor and the non-inverting pin of the first comparator and to a return of the first voltage source.

3. The circuit of claim 1, wherein the second circuit further comprises a means for sensing the second voltage, comprising:
    a first resistor coupled to an input of the second voltage source and a non-inverting pin of the second comparator; and
    a second resistor coupled to the first resistor and the non-inverting pin of the second comparator and to a return of the second voltage source.

4. The circuit of claim 1, wherein the first comparator comprises:
    a non-inverting pin coupled to a means for sensing the first voltage and to an inverting pin of the second comparator;
    an inverting pin coupled to a means for sensing the second voltage and to a non-inverting pin of the second comparator; and
    an output pin coupled to a gate of the first transistor.

5. The circuit of claim 1, wherein the second comparator comprises:
    a non-inverting pin coupled to a means for sensing the second voltage and to an inverting pin of the first comparator;
    an inverting pin coupled to a means for sensing the first voltage and to a non-inverting pin of the first comparator; and
    an output pin coupled to a gate of the third transistor.

6. The circuit of claim 1, wherein the first transistor comprises:
    a gate coupled to an output pin of the first comparator;
    a source coupled to a return of the first voltage source; and
    a drain coupled to a gate of the second transistor.

7. The circuit of claim 1, wherein the second transistor comprises:
    a gate coupled to a drain of the first transistor;
    a source coupled to a load; and
    a drain coupled to an input of the first voltage source.

8. The circuit of claim 1, wherein the third transistor comprises:
    a gate coupled to an output pin of the second comparator;
    a source coupled to a return of the second voltage source; and
    a drain coupled to a gate of the fourth transistor.

9. The circuit of claim 1, wherein the fourth transistor comprises:
    a gate coupled to a drain of the third transistor;
    a source coupled to a load; and
    a drain coupled to an input of the second voltage source.

10. The circuit of claim 1, wherein the second transistor comprises a first internal diode, wherein an anode of the first internal diode is coupled to a source of the second transistor, and a cathode of the first internal diode is coupled to a drain of the second transistor.

11. The circuit of claim 1, wherein the fourth transistor comprises a second internal diode, wherein an anode of the second internal diode is coupled to a source of the fourth transistor, and a cathode of the second internal diode is coupled to a drain of the fourth transistor.

12. A power supply circuit including a first voltage source and a second voltage source, comprising:
    a first circuit coupled to the first voltage source, wherein the first circuit comprises:
        a first comparator for comparing a first voltage from the first voltage source with a second voltage from the second voltage source,
        a first transistor coupled to the first comparator, wherein the first transistor conducts when the first voltage is higher than the second voltage, and
        a second transistor coupled to the first transistor and the first voltage source, wherein the second transistor conducts when the first transistor conducts, wherein the first voltage is provided as an output voltage when the second transistor conducts,
        wherein the second transistor comprises a first internal diode coupled to the second transistor, wherein the first internal diode prevents unwanted back flowing of current to the first voltage source; and
    a second circuit coupled to the second voltage source, wherein the second circuit comprises:
        a second comparator for comparing the second voltage with the first voltage,
        a third transistor coupled to the second comparator, wherein the third transistor conducts when the absolute value of the second voltage is higher than the absolute value of the first voltage, and a fourth transistor coupled to the third transistor and the second voltage source, wherein the fourth transistor conducts when the third transistor conducts, wherein the second voltage is provided as the output voltage when the fourth transistor conducts, wherein the fourth transistor comprises a second internal diode coupled to the fourth transistor, wherein the second internal diode prevents unwanted back flowing of current to the second voltage source.

13. The circuit of claim 12, wherein the first circuit further comprises a means for sensing the first voltage, comprising:

a first resistor coupled to an input of the first voltage source and a non-inverting pin of the first comparator; and a second resistor coupled to the first resistor and the non-inverting pin of the first comparator and to a return of the first voltage source.

14. The circuit of claim 12, wherein the second circuit further comprises a means for sensing the second voltage, comprising:

a first resistor coupled to an input of the second voltage source and a non-inverting pin of the second comparator; and a second resistor coupled to the first resistor and the non-inverting pin of the second comparator and to a return of the second voltage source.

15. The circuit of claim 12, wherein the first comparator comprises:

a non-inverting pin coupled to a means for sensing the first voltage and to an inverting pin of the second comparator;

an inverting pin coupled to a means for sensing the second voltage and to a non-inverting pin of the second comparator; and an output pin coupled to a gate of the first transistor.

16. The circuit of claim 12, wherein the second comparator comprises:

a non-inverting pin coupled to a means for sensing the second voltage and to an inverting pin of the first comparator;

an inverting pin coupled to a means for sensing the first voltage and to a non-inverting pin of the first comparator; and an output pin coupled to a gate of the third transistor.

17. The circuit of claim 12, wherein the first transistor comprises:

a gate coupled to an output pin of the first comparator;
a source coupled to a return of the first voltage source; and
a drain coupled to a gate of the second transistor.

18. The circuit of claim 12, wherein the second transistor comprises:

a gate coupled to a drain of the first transistor;
the source coupled to a load; and
the drain coupled to an input of the first voltage source.

19. The circuit of claim 12, wherein the third transistor comprises:

a gate coupled to an output pin of the second comparator;
a source coupled to a return of the second voltage source; and
a drain coupled to a gate of the fourth transistor.

20. The circuit of claim 12, wherein the fourth transistor comprises:

a gate coupled to a drain of the third transistor;
the source coupled to a load; and
the drain coupled to an input of the second voltage source.

21. The circuit of claim 12, wherein an anode of the first internal diode is coupled to a source of the second transistor, and a cathode of the first internal diode is coupled to a drain of the second transistor.

22. The circuit of claim 12, wherein an anode of the second internal diode is coupled to a source of the fourth transistor, and a cathode of the second internal diode is coupled to a drain of the fourth transistor.

23. A power supply circuit, including a first voltage source with a first input and a first return for providing a first voltage, and a second voltage source with a second input and a second return for providing a second voltage, comprising:

a first circuit coupled to the first voltage source, wherein the first circuit comprises:

a first means for sensing the first voltage, a first comparator comprising a first non-inverting pin, a first inverting pin, and a first output pin, wherein the first non-inverting pin is coupled to the first sensing means, wherein a third voltage is provided at the first output pin when the first voltage is higher than the second voltage, a first transistor comprising a first gate, a first source, and a first drain, wherein the first gate is coupled to the first output pin, wherein the first source is coupled to the first return, and a second transistor comprising a second gate, a second source, and a second drain, wherein the second gate is coupled to the first drain, wherein the second source is coupled to an output, wherein the second drain is coupled to the first input, wherein the second transistor is coupled to a first internal diode comprising a first anode side and a first cathode side, wherein the first anode side is coupled to the second source and the first cathode side is coupled to the second drain; and a second circuit coupled to the second voltage source, wherein the second circuit comprises:

a second means for sensing the second voltage, a second comparator comprising a second non-inverting pin, a second inverting pin, and a second output pin, wherein the second non-inverting pin is coupled to the second sensing means and to the first inverting pin, wherein the second inverting pin is coupled to the first non-inverting pin, wherein a fourth voltage is provided at the second output pin when the second voltage is higher than the first voltage, a third transistor comprising a third gate, a third emitter, and a third collector, wherein the third gate is coupled to the second output pin, wherein the third emitter is coupled to the second return, and a fourth transistor comprising a fourth gate, a fourth source, and a fourth drain, wherein the fourth gate is coupled to the third drain, wherein the fourth source is coupled to the output, wherein the fourth drain is coupled to the second input, wherein the fourth transistor comprises a second internal diode comprising a second anode side and a second cathode side, wherein the second anode side is coupled to the fourth source and the second cathode side is coupled to the fourth drain.

* * * * *